(12) United States Patent
Wu et al.

(10) Patent No.: US 10,998,874 B1
(45) Date of Patent: May 4, 2021

(54) NOISE SUPPRESSOR

(71) Applicant: National Taiwan University, Taipei (TW)

(72) Inventors: Tzong-Lin Wu, Taipei (TW); Chin-Yi Lin, Taipei (TW); Yang-Chih Huang, Taipei (TW)

(73) Assignee: National Taiwan University, Taipei (TW)

( * ) Notice: Subject to any disclaimer, the term of this patent is extended or adjusted under 35 U.S.C. 154(b) by 0 days.

(21) Appl. No.: 16/842,821

(22) Filed: Apr. 8, 2020

(30) Foreign Application Priority Data

Dec. 12, 2019 (TW) ................................. 108145518

(51) Int. Cl.
*H03H 7/09* (2006.01)
*H03H 7/12* (2006.01)
*H03H 7/01* (2006.01)

(52) U.S. Cl.
CPC .................................. *H03H 7/0115* (2013.01)

(58) Field of Classification Search
CPC combination set(s) only.
See application file for complete search history.

(56) References Cited

U.S. PATENT DOCUMENTS

| | | | | |
|---|---|---|---|---|
| 5,666,302 A | * | 9/1997 | Tanaka | H04B 1/58 708/819 |
| 7,956,704 B1 | * | 6/2011 | Acimovic | H01P 1/203 333/181 |
| 9,257,955 B2 | * | 2/2016 | Wu | H03H 7/427 |
| 9,577,852 B2 | * | 2/2017 | Wojnowski | H04L 25/0276 |
| 9,774,310 B2 | * | 9/2017 | Wu | H03H 7/1758 |

* cited by examiner

*Primary Examiner* — An T Luu
(74) *Attorney, Agent, or Firm* — Osha Bergman Watanabe & Burton LLP

(57) ABSTRACT

A noise suppressor includes a first differential-mode transmission module, a second differential-mode transmission module and a common-mode absorption module. The first and second differential-mode transmission modules are configured to receive a differential signal at one of the first and second differential-mode transmission modules, and output the differential signal at the other of the same. The common-mode absorption module is electrically connected to a reference node, and is configured to absorb common-mode noise of the differential signal from at least one of the first differential-mode transmission module or the second differential-mode transmission module.

20 Claims, 11 Drawing Sheets

NOISE SUPPRESSOR

CROSS-REFERENCE TO RELATED APPLICATION

This application claims priority of Taiwanese Invention Patent Application No. 108145518, filed on Dec. 12, 2019.

FIELD

The disclosure relates to a noise suppressor, and more particularly to a common-mode noise suppressor.

BACKGROUND

Differential transmission is widely used in high speed digital transmission systems. However, in real systems, signal energy experiences transition from differential mode to common mode because of unfavorable reasons such as vias existed in the circuit board, and traces on the circuit board that are asymmetric in structure, or that are mismatched in length. Therefore, common-mode noise is generated, and radiation interference appears on interior and exterior of the systems. Conventional common-mode noise suppressors, which suppress common-mode noise by reflecting the same, may be utilized to reduce radiation interference.

Referring to FIG. 1, a conventional reflective common-mode noise filter 1 for use in a high speed digital transmission interface transmits a differential signal and reflects common-mode noise. However, when the high speed digital transmission interface is electrically connected to another circuit element of a peripheral module, such as a wireless transmitter, the reflected common-mode noise may flow to the circuit element and cause interference thereto.

SUMMARY

Therefore, a solution that suppresses common-mode noise and also reduces the interference caused thereby (e.g., caused by reflected common-mode noise) is sought after.

An object of the disclosure is to provide a noise suppressor that can alleviate at least one of the drawbacks of the prior art.

The noise suppressor includes a first differential-mode transmission module, a second differential-mode transmission module and a common-mode absorption module. The first differential-mode transmission module includes a pair of first terminals, a pair of second terminals, and a third terminal. The second differential-mode transmission module includes a pair of first terminals that are respectively and electrically connected to the second terminals of the first differential-mode transmission module, a pair of second terminals, and a third terminal, wherein the pair of first terminals of the second differential-mode transmission module are electrically connected to the pair of second terminals of the first differential-mode transmission module respectively. The common-mode absorption module includes a first terminal that is electrically connected to the third terminal of the first differential-mode transmission module, a second terminal that is electrically connected to the third terminal of the second differential-mode transmission module, and a third terminal that is electrically connected to a reference node. The first and second differential-mode transmission modules are configured to receive a differential signal at the first terminals of the first differential-mode transmission module, and to permit the differential signal to be transmitted through the first and second differential-mode transmission modules to be outputted at the second terminals of the second differential-mode transmission module. The common-mode absorption module is configured to absorb common-mode noise of the differential signal from at least one of the first differential-mode transmission module or the second differential-mode transmission module.

BRIEF DESCRIPTION OF THE DRAWINGS

Other features and advantages of the disclosure will become apparent in the following detailed description of the embodiment(s) with reference to the accompanying drawings, of which.

DETAILED DESCRIPTION

Before the disclosure is described in greater detail, it should be noted that throughout the disclosure, when two or more elements are described as being "coupled in series", "connected in series", "serially coupled", "serially connected" or the like, it is merely intended to portray a serial connection between the two or more elements without necessarily implying that the currents flowing through the two or more elements are identical to each other and without limiting whether or not an additional element is coupled to a common node between two adjacent ones of the two or more elements. Essentially, "a series connection of elements", "a series coupling of elements" or the like as used throughout the disclosure should be interpreted as being such when looking at those elements alone.

Before the disclosure is described in greater detail, it should be noted that throughout the disclosure, an impedance component may include, but not limited to, any number of inductors, any number of capacitors, any number of resistors, any number of transmission lines, or a combination thereof that are connected in series or in parallel.

Before the disclosure is described in greater detail, it should be noted that throughout the disclosure, an input signal of a circuit having a low-pass frequency response has less insertion loss at low frequencies than at high frequencies, and an input signal of a circuit having an all-pass frequency response has insertion loss with a frequency response that resembles the frequency response of insertion loss of a lossy transmission line or a lossless transmission line.

Figure 1:
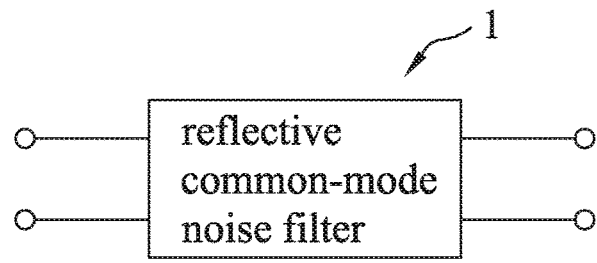
FIG. 1 is a block diagram of a conventional reflective common-mode noise filter.
Figure 2:
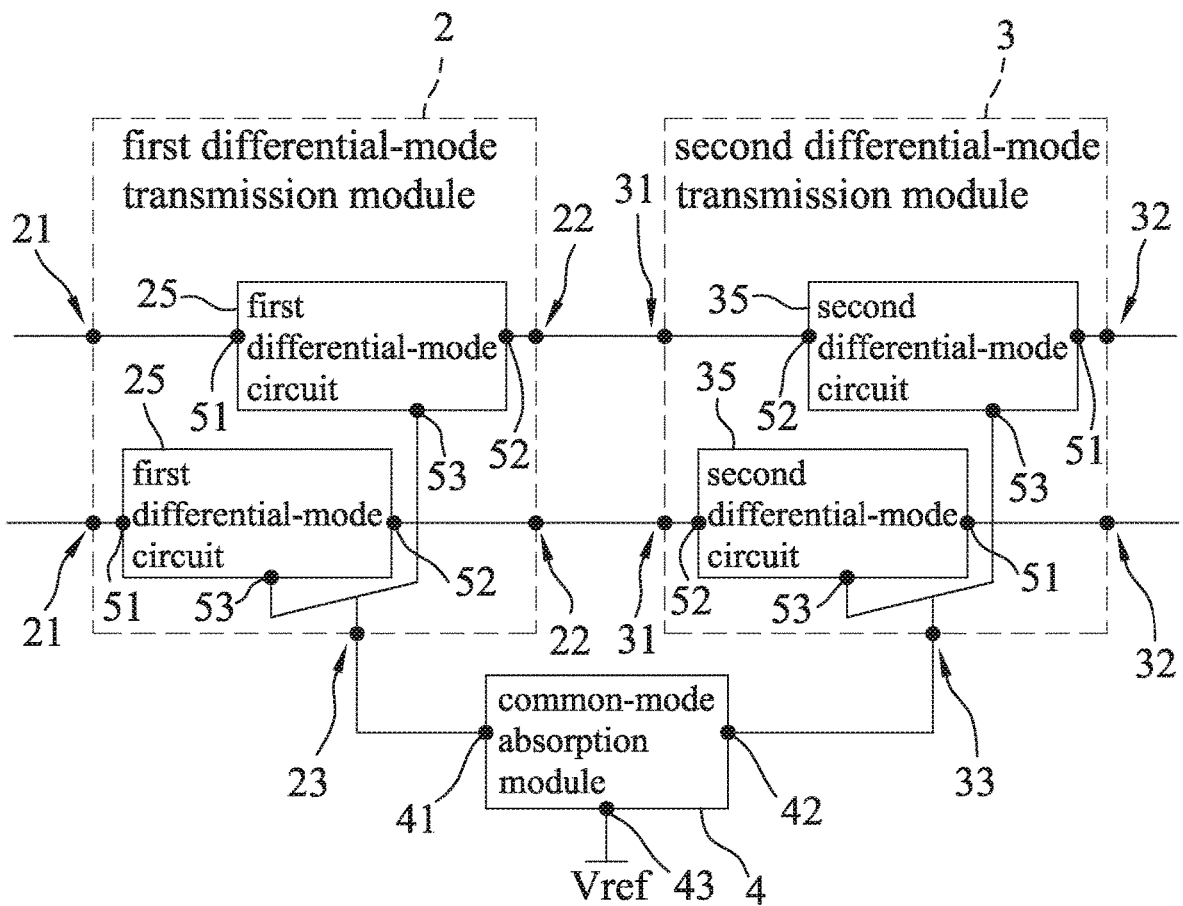
FIG. 2 is a block diagram exemplarily illustrating a noise suppressor according to an embodiment of the disclosure.

Referring to FIG. 2, a noise suppressor according to an embodiment of the disclosure includes a first differential-mode transmission module 2, a second differential-mode transmission module 3, and a common-mode absorption module 4. The first differential-mode transmission module 2 includes a pair of first terminals 21, a pair of second terminals 22, and a third terminal 23. Similarly, the second differential-mode transmission module 3 includes a pair of first terminals 31, a pair of second terminals 32, and a third terminal 33. The common-mode absorption module 4 includes a first terminal 41, a second terminal 42 and a third terminal 43. The pair of second terminals 22 of the first differential-mode transmission module 2 are respectively and electrically connected to the pair of first terminals 31 of the second differential-mode transmission module 3. The third terminal 23 of the first differential-mode transmission module 2 is electrically connected to the first terminal 41 of the common-mode absorption module 4. The third terminal 33 of the second differential-mode transmission module 3 is electrically connected to the second terminal 42 of the common-mode absorption module 4.

The first differential-mode transmission module 2 further includes two first differential-mode circuits 25, each of which has a first terminal 51 electrically connected to a respective one of the first terminals 21 of the first differential-mode transmission module 2, a second terminal 52 electrically connected to a respective one of the second terminals 22 of the first differential-mode transmission modules 2, and a third terminal 53 electrically connected to the third terminal 23 of the first differential-mode transmission module 2.

The second differential-mode transmission module 3 further includes two second differential-mode circuits 35, each of which has a first terminal 51 electrically connected to a respective one of the second terminals 32 of the second differential-mode transmission modules 3, a second terminal 52 electrically connected to a respective one of the first terminals 31 of the second differential-mode transmission module 3, and a third terminal 53 electrically connected to the third terminal 33 of the second differential-mode transmission module 3.

The third terminal 43 of the common-mode absorption module 4 is electrically connected to a reference node (Vref), which only has a direct current (DC) voltage, without any alternating current (AC) voltage. That is, the voltage level of the reference node (Vref) may be regarded as zero for radio frequency signals, but is not necessarily regarded as zero for DC signals. The reference node (Vref) may be referred to as "ground" hereafter.

The disclosed noise suppressor is configured to be bidirectional. That is, the disclosed noise suppressor may receive a differential signal at any one of the first terminals 21 of the first differential-mode transmission module 2 and the second terminals 32 of the second differential-mode transmission module 3, and output the differential signal at the other one of the same.

Figure 3:
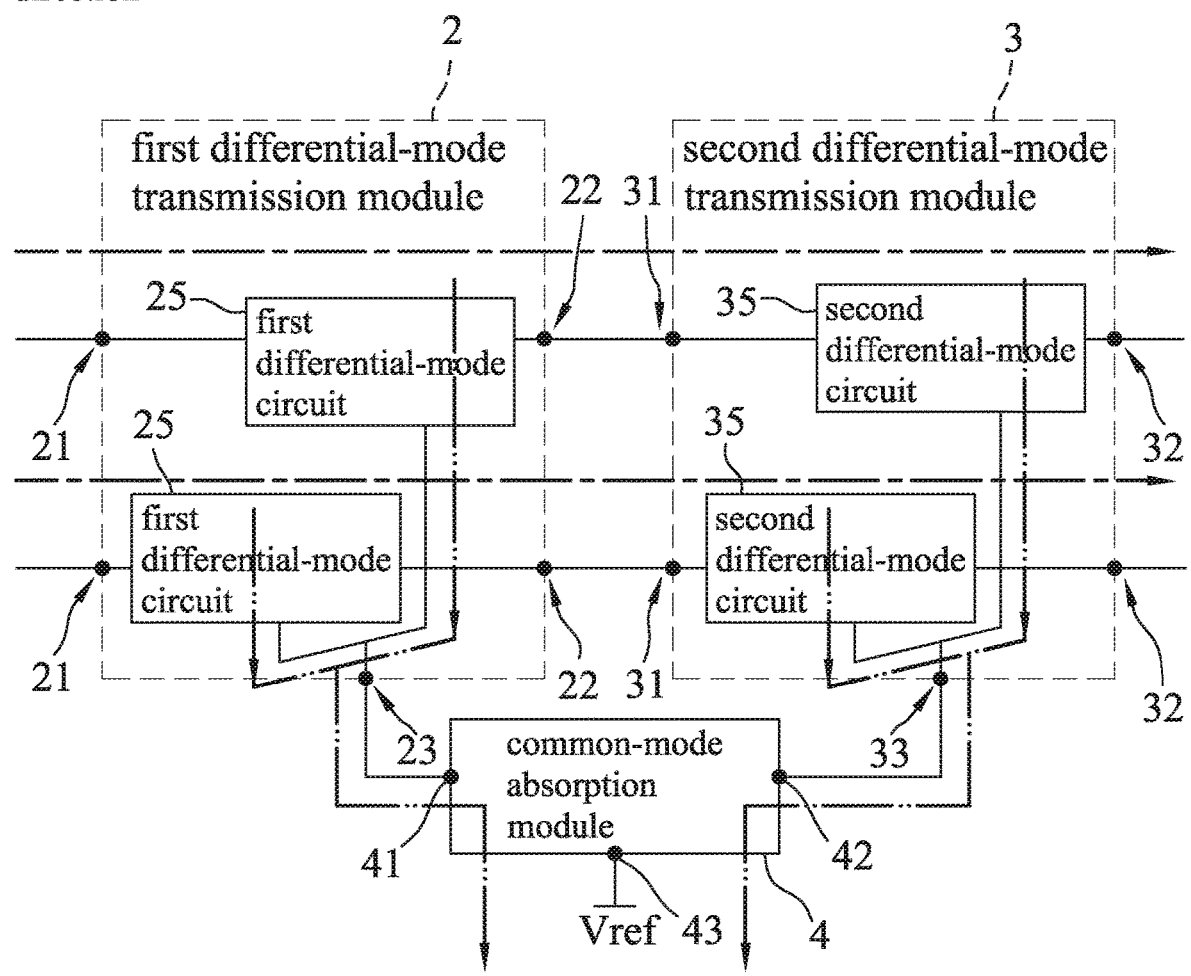
FIG. 3 is a block diagram exemplarily illustrating a signal flow in a first transmission direction of the noise suppressor of FIG. 2 according to an embodiment of the disclosure.

For example, referring to FIG. 3, when a differential signal is inputted into the first terminals 21 of the first differential-mode transmission module 2, the differential signal is transmitted through the first and second differential-mode transmission modules 2, 3 in the first transmission direction, and then outputted at the second terminals 32 of the second differential-mode transmission module 3, as illustrated by the short-dash-long-dash line in FIG. 3. Meanwhile, the common-mode noise of the differential signal is absorbed by the common-mode absorption module 4 from the first differential-mode transmission module 2 and/or second differential-mode transmission module 3, as illustrated by the long-dash-double-dot line in FIG. 3, so that, in comparison with the common-mode noise viewed at the first terminal 21 of the first differential-mode transmission module 2, the common-mode noise viewed at the second terminal 32 of the second differential-mode transmission module 3 is reduced by the portion absorbed by the common-mode absorption module 4. That is, the differential-mode component of the differential signal goes through the first and second differential-mode transmission modules 2, 3, and the common-mode component of the differential signal goes to the common-mode absorption module 4 and further to the ground (i.e., energy of the common-mode component of the differential signal is consumed by the common-mode absorption module 4). In this disclosure, absorption of the common-mode noise by the common-mode absorption module 4 is not limited to complete absorption, but partialabsorption as well, which reduces the common-mode noise to an allowed level lower than a threshold specified by a communication specification.

Figure 4:
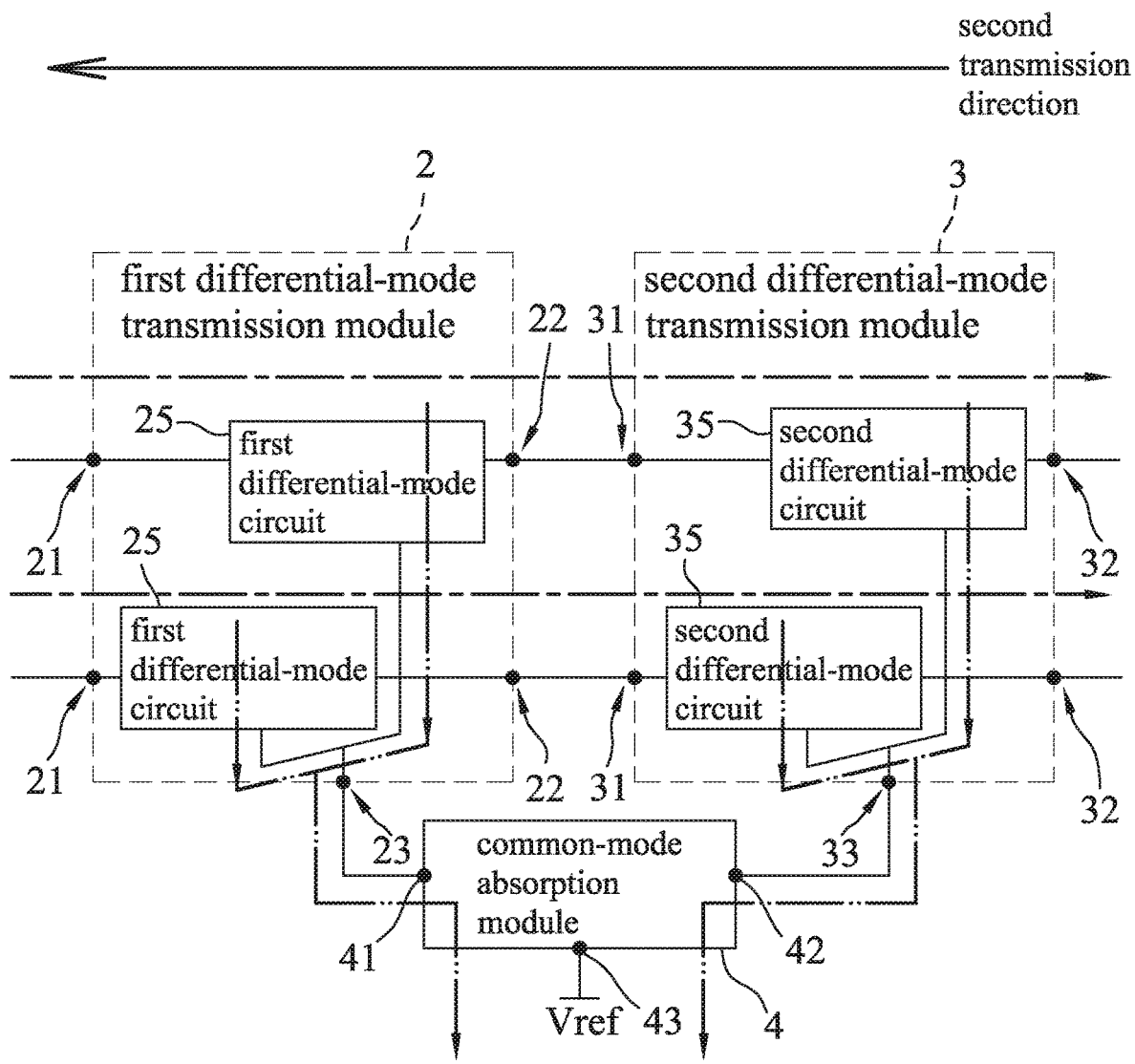
FIG. 4 is a block diagram exemplarily illustrating a signal flow in a second transmission direction of the noise suppressor of FIG. 2 according to an embodiment of the disclosure.

On the other hand, referring to FIG. 4, when a differential signal is inputted into the second terminal 32 of the second differential-mode transmission module 3, the differential signal is transmitted through the first and second differential-mode transmission modules 2, 3 in a second transmission direction, and then outputted at the first terminal 21 of the first differential-mode transmission module 2, as illustrated by the short-dash-long-dash line in FIG. 4. Meanwhile, the common-mode noise of the differential signal is also absorbed by the common-mode absorption module 4 from the first differential-mode transmission module 2 and/ or the second differential-mode transmission module 3, as illustrated by the long-dash-double-dot line in FIG. 4, so that, in comparison with the common-mode noise viewed at the second terminal 32 of the second differential-mode transmission module 3, the common-mode noise viewed at the first terminal 21 of the first differential-mode transmission module 2 is reduced by the portion absorbed by the common-mode absorption module 4.

According to some embodiments, the common-mode absorption module 4 may be configured to resonate with the first differential-mode transmission module 2 in a first resonant frequency band in order to absorb the common-mode noise from the first differential-mode transmission module 2 in the first resonant frequency band, and be configured to resonate with the second differential-mode transmission module 3 in a second resonant frequency band in order to absorb the common-mode noise from the second differential-mode transmission module 3 in the second resonant frequency band.

FIGS. 5-10 illustrate six different exemplary implementations of a differential-mode circuit. Each of the differential-mode circuits illustrated in FIGS. 5-10 may be utilized to implement any of the first and second differential-mode circuits 25, 35. As such, the differential-mode circuits illustrated in FIGS. 5-10 each have a first terminal 51, a second terminal 52 and a third terminal 53, as with the first and second differential-mode circuits 25, 35 depicted in FIG. 2. In some embodiments, each of the first and second differential-mode circuits 25, 35 may be a circuit having a low-pass frequency response or an all-pass frequency response.

Figure 5:
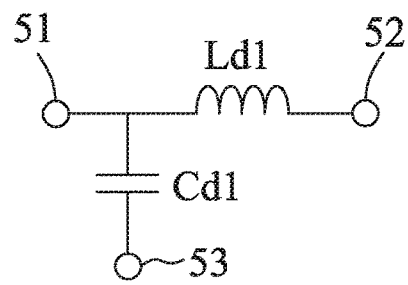
FIGS. 5-10 are circuit diagrams each of which illustrates a different implementation of a differential-mode circuit of the noise suppressor of FIG. 2 according to some embodiments of the disclosure.

FIG. 5 illustrates a first implementation of a differential-mode circuit that includes an inductor (Ld1) and a capacitor (Cd1). The inductor (Ld1) has a first terminal electrically connected to the first terminal 51 of the differential-mode circuit, and a second terminal electrically connected to the second terminal 52 of the differential-mode circuit. That is, the inductor Ld1 is connected between the first and second terminals 51, 52 of the differential-mode circuit. The capacitor (Cd1) is electrically connected between the first and third terminals 51, 53 of the differential-mode circuit.

Figure 6:
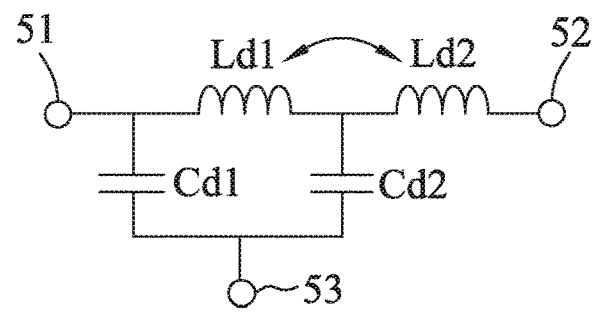

FIG. 6 illustrates a second implementation of a differential-mode circuit. The differential-mode circuit illustrated in FIG. 6 includes two cascaded circuit blocks each consisting of an inductor and a capacitor that are connected as the inductor (Ld1) and a capacitor (Cd1) shown in FIG. 5. Specifically, the differential-mode circuit of FIG. 6 includes a first inductor (Ld1), a second inductor (Ld2) electromagnetically coupled to the first inductor (Ld1), a first capacitor (Cd1), and a second capacitor (Cd2). The first and second inductors (Ld1, Ld2) are serially connected between the first and second terminals 51, 52 of the differential-mode circuit. The first capacitor (Cd1) is electrically connected between a first terminal of the first inductor (Ld1), and the third terminal 53 of the differential-mode circuit. The second capacitor (Cd2) is electrically connected between the third terminal 53 of the differential-mode circuit, and a first terminal of the second inductor (Ld2) that connects to a second terminal of the first inductor (Ld1). According to some embodiments, a differential-mode circuit composed of cascaded three or more of said circuit block consisting of an inductor and a capacitor may be utilized to implement any of the first and second differential-mode circuits 25, 35, too.

Figure 7:
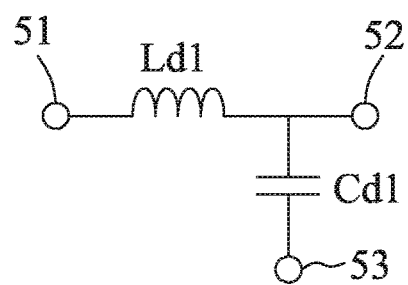

FIG. 7 illustrates a third implementation of a differential-mode circuit that includes an inductor (Ld1) and a capacitor (Cd1). The differential-mode circuit of FIG. 7 is similar to that of FIG. 5, but the capacitor (Cd1) in FIG. 7 is electrically connected between the second and third terminals 52, 53, rather than between the first and third terminals 51, 53.

Figure 8:
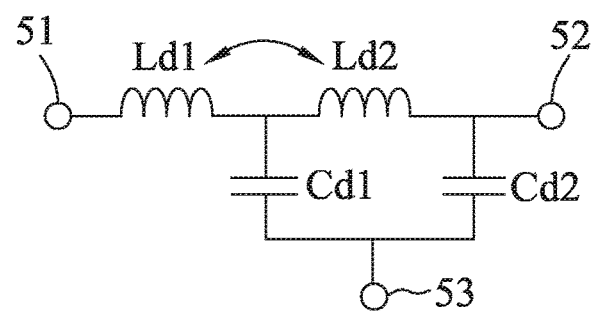

FIG. 8 illustrates a fourth implementation of a differential-mode circuit, which includes two cascaded circuit blocks each consisting of an inductor and a capacitor that are connected as the inductor (Ld1) and the capacitor (Cd1) shown in FIG. 7. Similarly, a differential-mode circuit composed of cascaded three or more of said circuit block consisting of an inductor and a capacitor may be utilized to implement any of the first and second differential-mode circuits 25, 35 in some embodiments.

Figure 9:
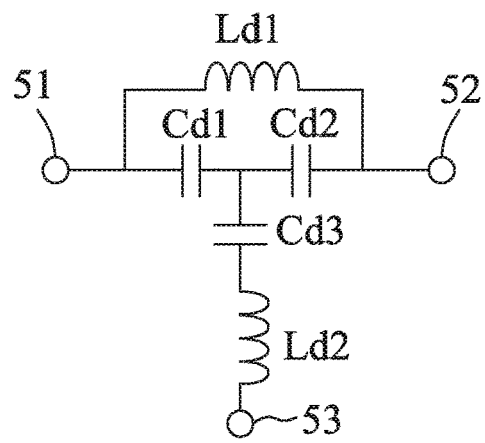

FIG. 9 illustrates a fifth implementation of a differential-mode circuit that includes two inductors (Ld1, Ld2) and three capacitors (Cd1, Cd2, Cd3). The inductor (Ld1) is electrically connected between the first and second terminals 51, 52 of the differential-mode circuit. Two capacitors (Cd1, Cd2) are connected in series, and the combination of the serially connected capacitors (Cd1, Cd2) is electrically connected between the first and second terminals 51, 52. The capacitor (Cd3) and the inductor (Ld2) are connected in series, and the combination of the serially connected capacitor (Cd3) and inductor (Ld2) is electrically connected between the third terminal 53 of the differential-mode circuit and a common node of the capacitors (Cd1, Cd2) (i.e., the node that joints the capacitors (Cd1, Cd2) together).

Figure 10:
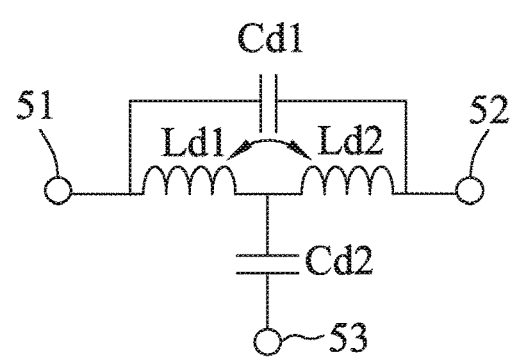

FIG. 10 illustrates a sixth implementation of a differential-mode circuit that includes two capacitors (Cd1, Cd2), and two inductors (Ld1, Ld2) that are electromagnetically coupled. The capacitor (Cd1) is electrically connected between the first and second terminals 51, 52 of the differential-mode circuit. The two inductors (Ld1, Ld2) are connected in series, and the combination of the serially connected inductors (Ld1, Ld2) is electrically connected between the first and second terminals 51, 52. The capacitor (Cd2) is electrically connected between the third terminal 53 of the differential-mode circuit and a common node of the inductors (Ld1, Ld2), thus forming a Y-shape connection among the three terminals 51-53 of the differential-mode circuit.

FIGS. 11-23 illustrate thirteen exemplary different implementations of the common-mode absorption module 4.

Figure 11:
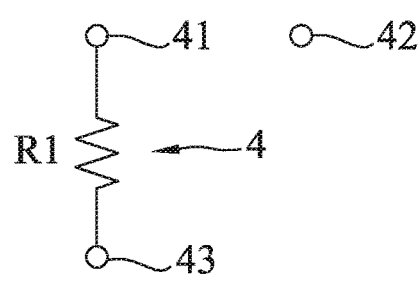
FIGS. 11-23 are circuit diagrams each of which illustrates a different implementation of a common-mode absorption module of the noise suppressor of FIG. 2 according to some embodiments of the disclosure.

Referring to FIG. 11, a first implementation of the common-mode absorption module 4 includes a resistor (R1) electrically connected between the first and third terminals 41, 43 of the common-mode absorption module 4. As shown in FIG. 11, since the second and third terminals 42, 43 of the common-mode absorption module 4 are in an open circuit, the common-mode absorption module 4 only receives the common-mode noise from the first differential-mode transmission module 2 (which is connected to the first terminal 41).

Figure 12:
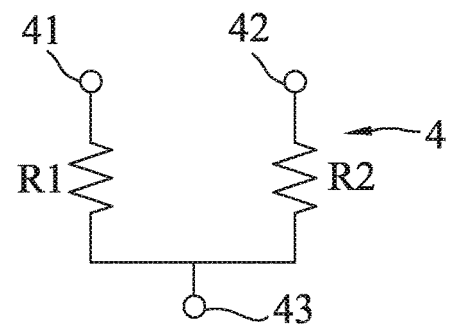

Referring to FIG. 12, a second implementation of the common-mode absorption module 4 includes two resistors (R1, R2). The resistor (R1) is electrically connected between the first and third terminals 41, 43, just like the resistor (R1) of FIG. 11. The resistor (R2) is electrically connected between the second and third terminals 42, 43.

Figure 13:
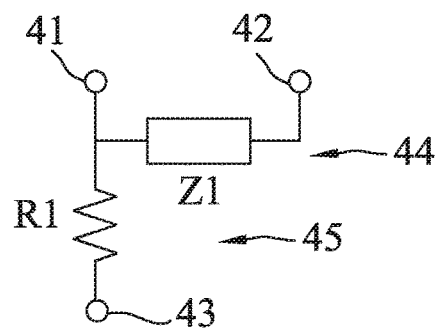

Referring to FIG. 13, a third implementation of the common-mode absorption module 4 includes a resonant circuit 44 and an energy consumption circuit 45. The resonant circuit 44 is electrically connected to the first and second terminals 41, 42 of the common-mode absorption module 4, and is configured to resonate with at least one of the first differential-mode transmission module 2 or the second differential-mode transmission module 3. The energy consumption circuit 45 is electrically connected to both the resonant circuit 44 and the third terminal 43 of the common-mode absorption module 4, and is configured to receive the common-mode noise via the resonant circuit 44, and to consume the energy of the received common-mode noise. The resonant circuit 44 includes an impedance component (Z1) that is electrically connected between the first and second terminals 41, 42 of the common-mode absorption module 4. The energy consumption circuit 45 includes a resistor (R1) that is electrically connected between the first and third terminals 41, 43 of the common-mode absorption module 4.

Figure 14:
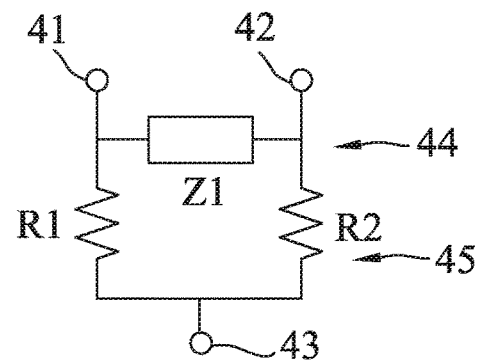

Referring to FIG. 14, a fourth implementation of the common-mode absorption module 4 is illustrated. The common-mode absorption module 4 shown in FIG. 14 is similar to that in FIG. 13, but the energy consumption circuit 45 in FIG. 14 further includes another resistor (R2) that is electrically connected between the second and third terminals 42, 43 of the common-mode absorption module 4.

Figure 15:
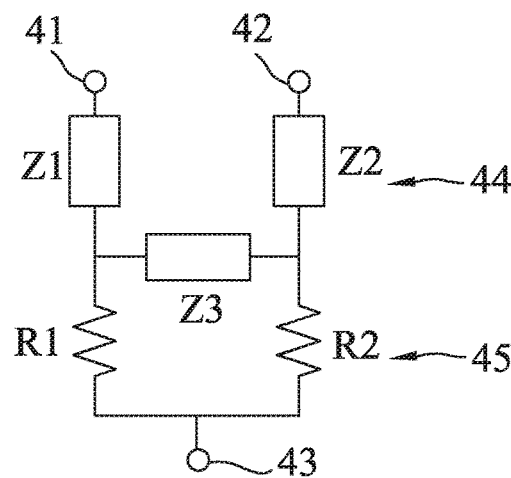

Referring to FIG. 15, a fifth implementation of the common-mode absorption module 4 that also includes a resonant circuit 44 and an energy consumption circuit 45 is illustrated. This resonant circuit 44 of FIG. 15 includes three impedance components (Z1, Z2, Z3). The impedance component (Z3) has a first terminal and a second terminal. The impedance component (Z1) is electrically connected between the first terminal 41 of the common-mode absorption module 4 and the first terminal of the impedance component (Z3). The impedance component (Z2) is electrically connected between the second terminal 42 of the common-mode absorption module 4 and the second terminal of the third impedance component (Z3). This energy consumption circuit 45 of FIG. 15 includes two resistors (R1, R2). The resistor (R1) is electrically connected between the first terminal of the impedance component (Z3) and the third terminal 43 of the common-mode absorption module 4. The resistor (R2) is electrically connected between the second terminal of the impedance component (Z3) and the third terminal 43 of the common-mode absorption module 4.

Figure 16:
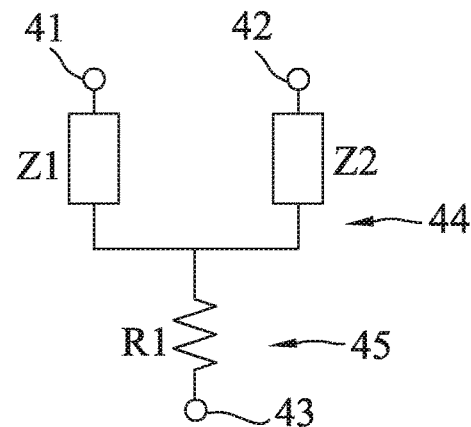

Referring to FIG. 16, a sixth implementation of the common-mode absorption module 4 that also includes a resonant circuit 44 and an energy consumption circuit 45 is illustrated. This resonant circuit 44 of FIG. 16 includes two impedance components (Z1, Z2). The impedance component (Z1) has a first terminal and a second terminal, wherein said first terminal is electrically connected to the first terminal 41 of the common-mode absorption module 4. The impedance component (Z2) is electrically connected between the second terminal of the impedance component (Z1) and the second terminal 42 of the common-mode absorption module 4. This energy consumption circuit 45 of FIG. 16 includes a resistor (R1) that is electrically connected between the second terminal of the impedance component (Z1) and the third terminal 43 of the common-mode absorption module 4.

Figure 17:
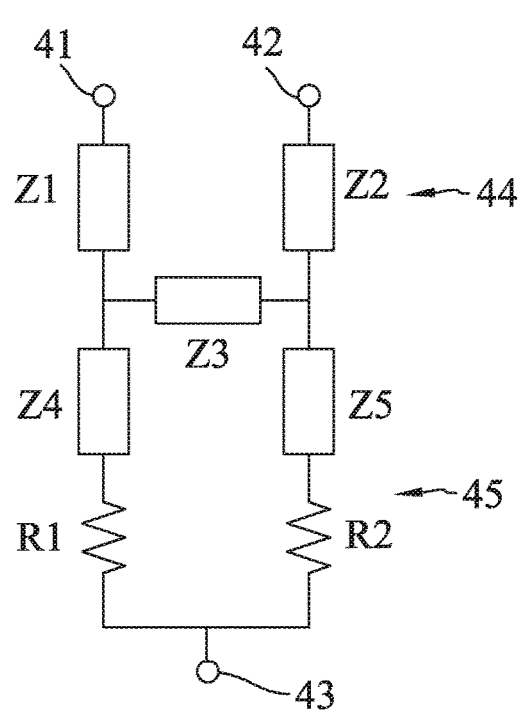

Referring to FIG. 17, a seventh implementation of the common-mode absorption module 4 that also includes a resonant circuit 44 and an energy consumption circuit 45 is illustrated. This resonant circuit 44 of FIG. 17 includes five impedance components (Z1, Z2, Z3, Z4, Z5). The impedance components (Z4, Z5) each have a first terminal and a second terminal. The impedance component (Z1) is electrically connected between the first terminal 41 of the common-mode absorption module 4 and the first terminal of the impedance component (Z4). The impedance component (Z2) is electrically connected between the second terminal 42 of the common-mode absorption module 4 and the first terminal of the impedance component (Z5). The impedance component (Z3) is electrically connected between the first terminal of the impedance component (Z4) and the first terminal of the impedance component (Z5). This energy consumption circuit 45 of FIG. 17 includes two resistors (R1, R2). The resistor (R1) is electrically connected between the second terminal of the impedance component (Z4) and the third terminal 43 of the common-mode absorption module 4. The resistor (R2) is electrically connected between the second terminal of the impedance component (Z5) and the third terminal 43 of the common-mode absorption module 4.

Figure 18:
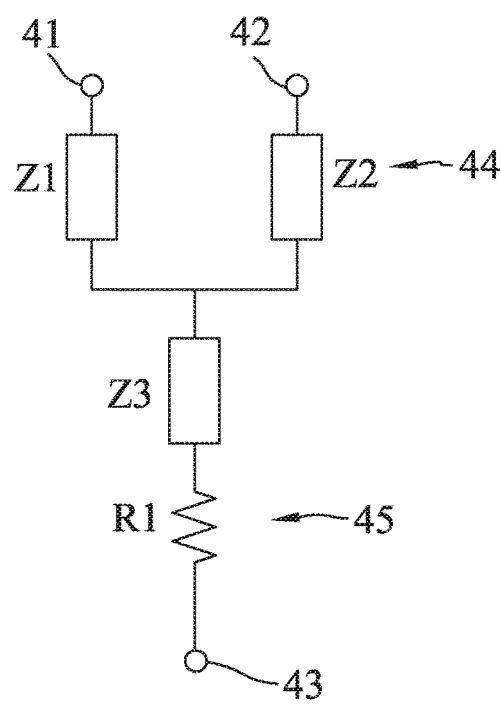

Referring to FIG. 18, an eighth implementation of the common-mode absorption module 4 that also includes a resonant circuit 44 and an energy consumption circuit 45 is illustrated. This resonant circuit 44 of FIG. 18 includes three impedance components (Z1, Z2, Z3). The impedance component (Z3) has a first terminal and a second terminal. The impedance component (Z1) is electrically connected between the first terminal 41 of the common-mode absorption module 4 and the first terminal of the impedance component (Z3). The impedance component (Z2) is electrically connected between the second terminal 42 of the common-mode absorption module 4 and the first terminal of the impedance component (Z3). This energy consumption circuit 45 of FIG. 18 includes a resistor (R1) that is electrically connected between the second terminal of the impedance component (Z4) and the third terminal 43 of the common-mode absorption module 4.

Figure 19:
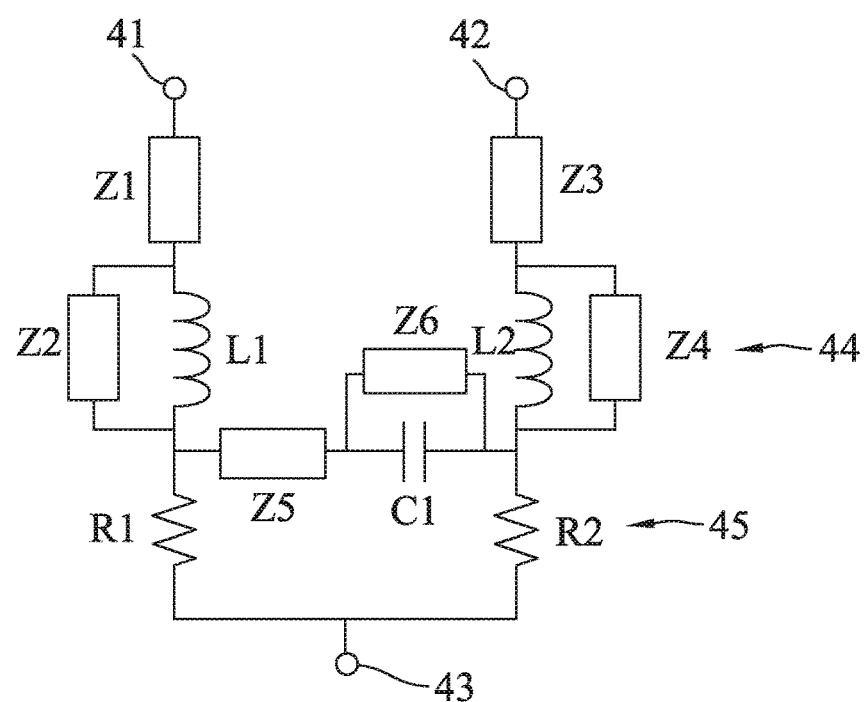

Referring to FIG. 19, a ninth implementation of the common-mode absorption module 4 that also includes a resonant circuit 44 and an energy consumption circuit 45 is illustrated. This resonant circuit 44 of FIG. 19 includes six impedance components (Z1, Z2, Z3, Z4, Z5, Z6), two inductors (L1, L2), and a capacitor (C1). The inductors (L1, L2) and the capacitor (C1) are respectively connected with the impedance components (Z2, Z4, Z6) in parallel. The impedance components (Z2, Z4, Z6) each have a first terminal and a second terminal. The second terminal of the impedance component (Z6) is electrically connected to the second terminal of the impedance component (Z4). The impedance component (Z1) is electrically connected between the first terminal 41 of the common-mode absorption module 4 and the first terminal of the impedance component (Z2). The impedance component (Z3) is electrically connected between the second terminal 42 of the common-mode absorption module 4 and the first terminal of the impedance component (Z4). The impedance component (Z5) is electrically connected between the second terminal of the impedance component (Z2) and the first terminal of the impedance component (Z6). This energy consumption circuit 45 of FIG. 19 includes two resistors (R1, R2). The resistor (R1) is electrically connected between the second terminal of the impedance component (Z2) and the third terminal 43 of the common-mode absorption module 4. The resistor (R2) is electrically connected between the second terminal of the impedance component (Z4) and the third terminal 43 of the common-mode absorption module 4.

Figure 20:
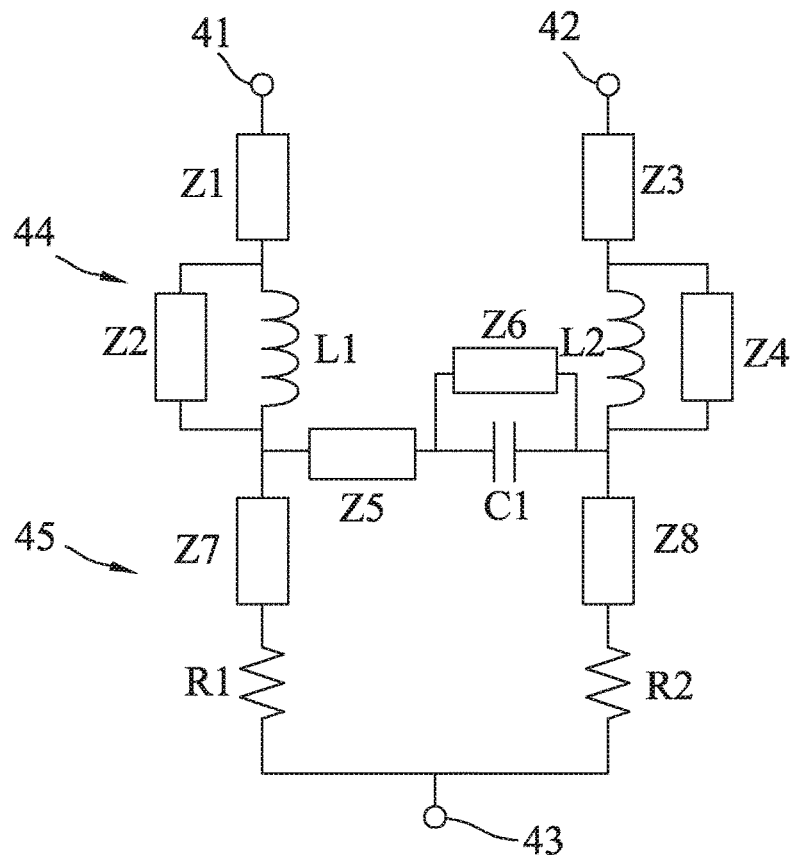

Referring to FIG. 20, a tenth implementation of the common-mode absorption module 4 that also includes a resonant circuit 44 and an energy consumption circuit 45 is illustrated. It can be seen from FIGS. 19 and 20 that the circuits illustrated therein are quite similar, only that the circuit of FIG. 20 has two more impedance components (Z7, Z8). Specifically, this resonant circuit 44 of FIG. 20 includes eight impedance components (Z1, Z2, Z3, Z4, Z5, Z6, Z7, Z8), two inductors (L1, L2), and a capacitor (C1). The inductors (L1, L2) and the capacitor (C1) are respectively connected with the impedance components (Z2, Z4, Z6) in parallel. The impedance components (Z2, Z4, Z6, Z7, Z8) each have a first terminal and a second terminal. The first terminal of the impedance component (Z8) is electrically connected to the second terminal of the impedance component (Z4) and the second terminal of the impedance component (Z6). The first terminal of the impedance component (Z7) is electrically connected to the second terminal of the impedance component (Z2). The impedance component (Z1) is electrically connected between the first terminal 41 of the common-mode absorption module 4 and the first terminal of the impedance component (Z2). The impedance component (Z3) is electrically connected between the second terminal 42 of the common-mode absorption module 4 and the first terminal of the impedance component (Z4). The impedance component (Z5) is electrically connected between the second terminal of the impedance component (Z2) and the first terminal of the impedance component (Z6). This energy consumption circuit 45 of FIG. 20 similarly includes two resistors (R1, R2). The resistor (R1) is electrically connected between the second terminal of the impedance component (Z7) and the third terminal 43 of the common-mode absorption module 4. The resistor (R2) is electrically connected between the second terminal of the impedance component (Z8) and the third terminal 43 of the common-mode absorption module 4.

Figure 21:
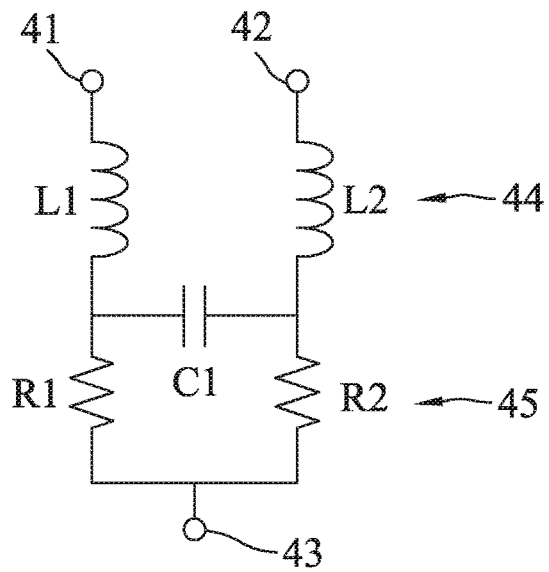

Referring to FIG. 21, an eleventh implementation of the common-mode absorption module 4 that also includes a resonant circuit 44 and an energy consumption circuit 45 is illustrated. This resonant circuit 44 of FIG. 21 includes two inductors (L1, L2), and a capacitor (C1). The capacitor (C1) has a first terminal and a second terminal. The inductor (L1) is electrically connected between the first terminal 41 of the common-mode absorption module 4 and the first terminal of the capacitor (C1). The inductor (L2) is electrically connected between the second terminal 42 of the common-mode absorption module 4 and the second terminal of the capacitor (C1). This energy consumption circuit 45 of FIG. 21 includes two resistors (R1, R2). The resistor (R1) is electrically connected between the first terminal of the capacitor (C1) and the third terminal 43 of the common-mode absorption module 4. The resistor (R2) is electrically connected between the second terminal of the capacitor (C1) and the third terminal 43 of the common-mode absorption module 4.

Figure 22:
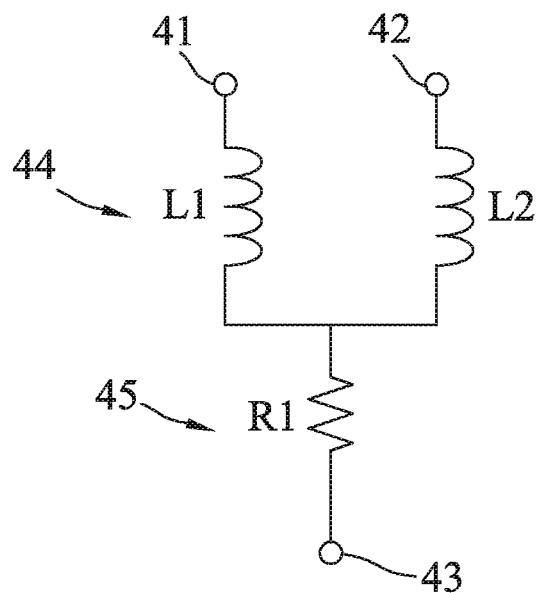

Referring to FIG. 22, a twelfth implementation of the common-mode absorption module 4 that also includes a resonant circuit 44 and an energy consumption circuit 45 is illustrated. This resonant circuit 44 of FIG. 22 includes two inductors (L1, L2). The inductor (L1) has a first terminal and a second terminal, wherein said first terminal is electrically connected to the first terminal 41 of the common-mode absorption module 4. The inductor (L2) is electrically connected between the second terminal of the inductor (L1) and the second terminal 42 of the common-mode absorption module 4. This energy consumption circuit 45 of FIG. 22 includes a resistor (R1) that is electrically connected between the second terminal of the inductor (L1) and the third terminal 43 of the common-mode absorption module 4.

Figure 23:
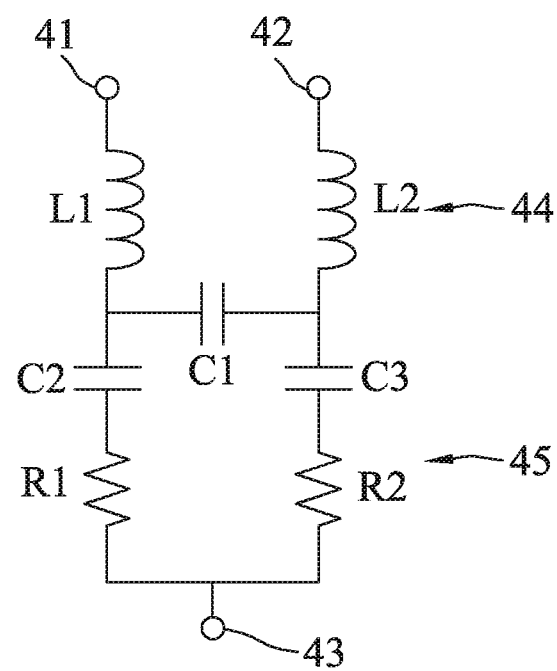

Referring to FIG. 23, a thirteenth implementation of the common-mode absorption module 4 that also includes a resonant circuit 44 and an energy consumption circuit 45 is illustrated. This resonant circuit 44 of FIG. 23 includes two inductors (L1, L2), and three capacitors (C1, C2, C3). The capacitors (C2, C3) each have a first terminal and a second terminal. The inductor (L1) is electrically connected between the first terminal 41 of the common-mode absorption module 4 and the first terminal of the capacitor (C2). The inductor (L2) is electrically connected between the second terminal 42 of the common-mode absorption module 4 and the first terminal of the capacitor (C3). The capacitor (C1) is electrically connected between the first terminal of the capacitor (C2) and the first terminal of the capacitor (C3). This energy consumption circuit 45 of FIG. 23 includes two resistors (R1, R2). The resistor (R1) is electrically connected between the second terminal of the capacitor (C2) and the third terminal 43 of the common-mode absorption module 4. The resistor (R2) is electrically connected between the second terminal of the capacitor (C3) and the third terminal 43 of the common-mode absorption module 4.

Figure 24:
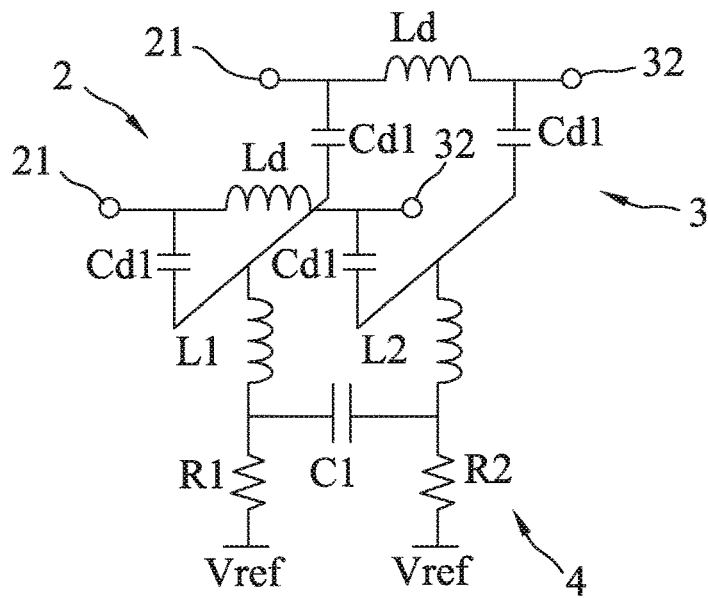
FIG. 24 is a circuit diagram exemplarily illustrating a first implementation of the noise suppressor of FIG. 2 according to an embodiment of the disclosure.

FIG. 24 illustrates a first implementation of the disclosed noise suppressor according to an embodiment of the disclosure. In this implementation, the two first differential-mode circuits 25 and the two second differential-mode circuits 35 all utilize the circuit shown in FIG. 5, and the common-mode absorption module 4 utilizes the circuit shown in FIG. 21. In FIG. 24, the inductor (Ld1) (see FIG. 5) of the upper first differential-mode circuits 25 and the inductor (Ld1) of the upper second differential-mode circuits 35 are depicted as an equivalent inductor (Ld), because they are serially connected and have the same current flow therethrough. Similarly, the inductor (Ld1) of the lower first differential-mode circuits 25 and the inductor (Ld1) of the lower second differential-mode circuits 35 are depicted as an equivalent inductor (Ld) in FIG. 24, too.

Figure 25:
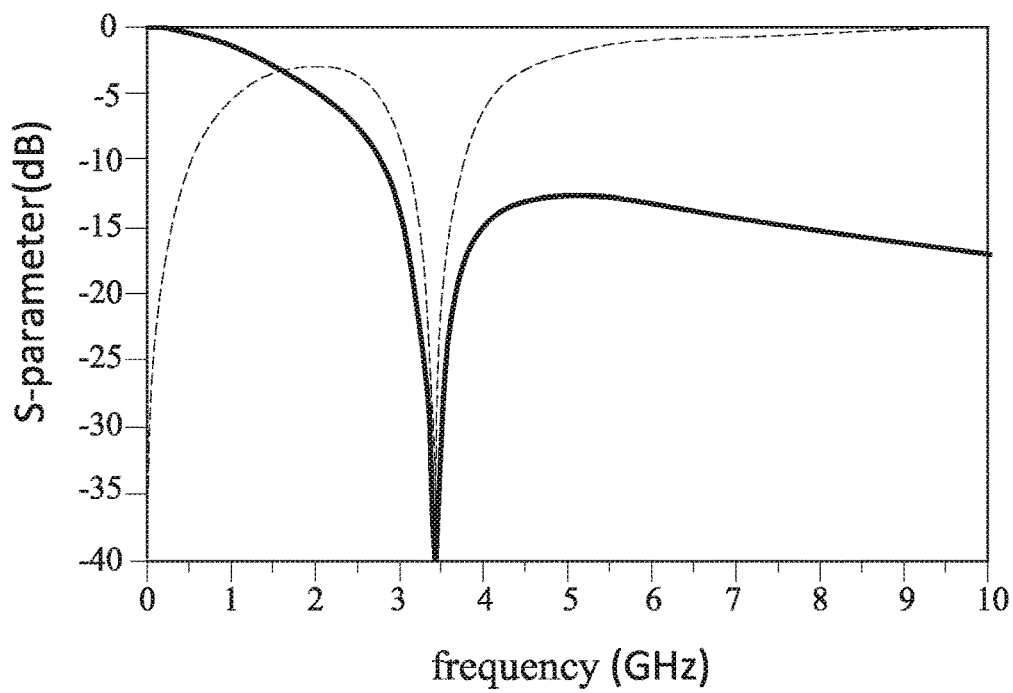
FIG. 25 is a frequency response diagram exemplarily illustrating transmission and reflection characteristics of common-mode noise of the circuit of the noise suppressor as depicted in FIG. 24 according to an embodiment of the disclosure.

FIG. 25 is a frequency response diagram that exemplarily illustrates the scattering parameters (S-parameters) respectively describing transmission and reflection characteristics of common-mode noise of the noise suppressor circuit of FIG. 24. The solid line in the diagram represents the S-parameter describing the transmission characteristic, and the broken line represents the S-parameter describing the reflection characteristic. It can be seen from the frequency response diagram that both transmission and reflection of common-mode noise are remarkably reduced in the frequency band of 3 GHz to 4 GHz, especially at the frequency of 3.4 GHz, which shows that the disclosed noise suppressor circuit of FIG. 24 may effectively absorb common-mode noise in said frequency band.

Figure 26:
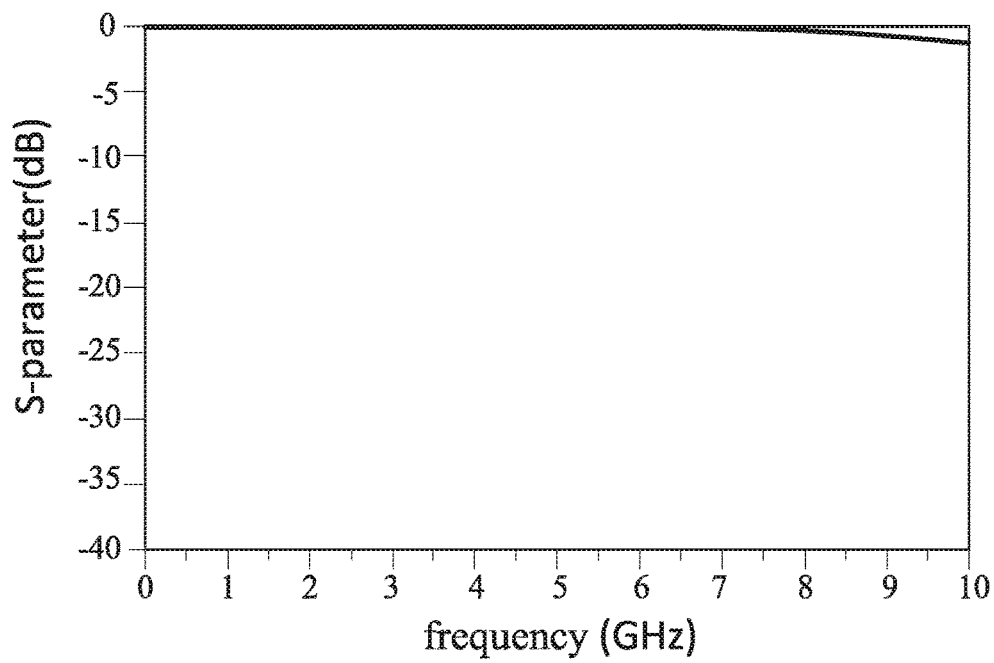
FIG. 26 is a frequency response diagram exemplarily illustrating transmission characteristic of differential-mode component of a differential signal transmitting through the circuit of FIG. 24 according to an embodiment of the disclosure.

FIG. 26 is a frequency response diagram that exemplarily illustrates the S-parameter describing transmission characteristic of a differential signal transmitting through the noise suppressor circuit of FIG. 24. It can be seen from the frequency response diagram that the differential signal may be well transmitted by said noise suppressor circuit.

Figure 27:
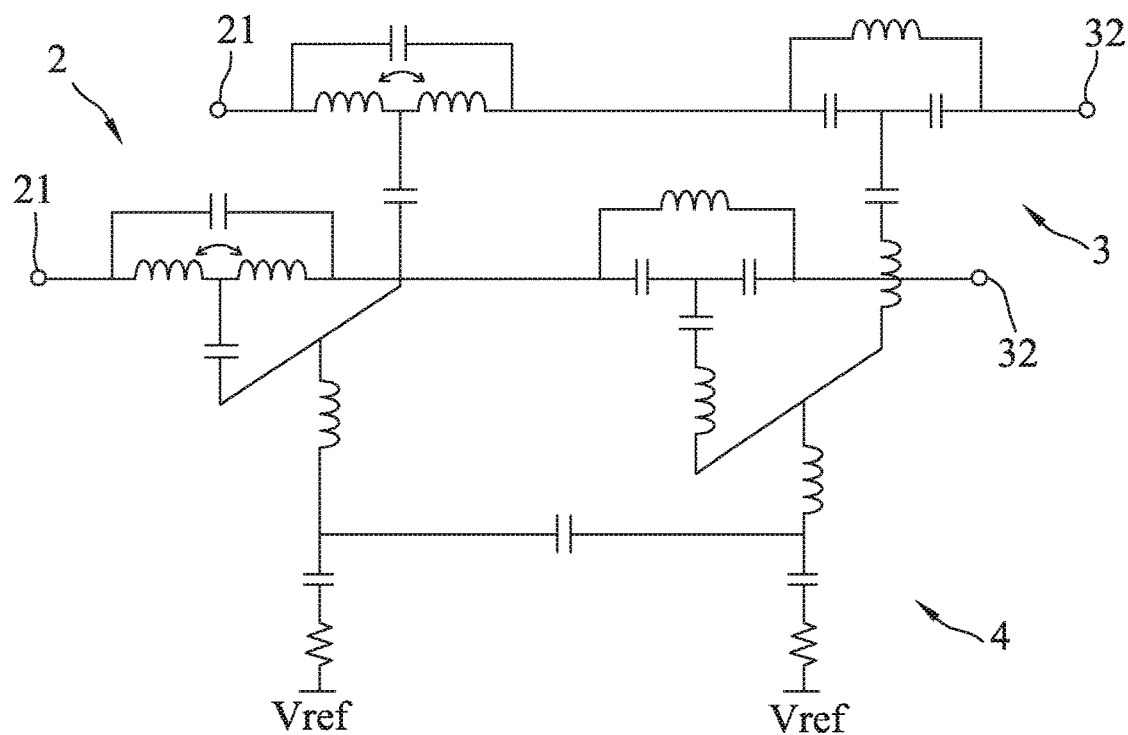
FIG. 27 is a circuit diagram exemplarily illustrating a second implementation of the noise suppressor of FIG. 2 according to an embodiment of the disclosure.

FIG. 27 illustrates a second implementation of the disclosed noise suppressor according to an embodiment of the disclosure. In this implementation, the two first differential-mode circuits 25 utilize the circuit shown in FIG. 10, the two second differential-mode circuits 35 utilize the circuit shown in FIG. 9, and the common-mode absorption module 4 utilizes the circuit shown in FIG. 23.

Figure 28:
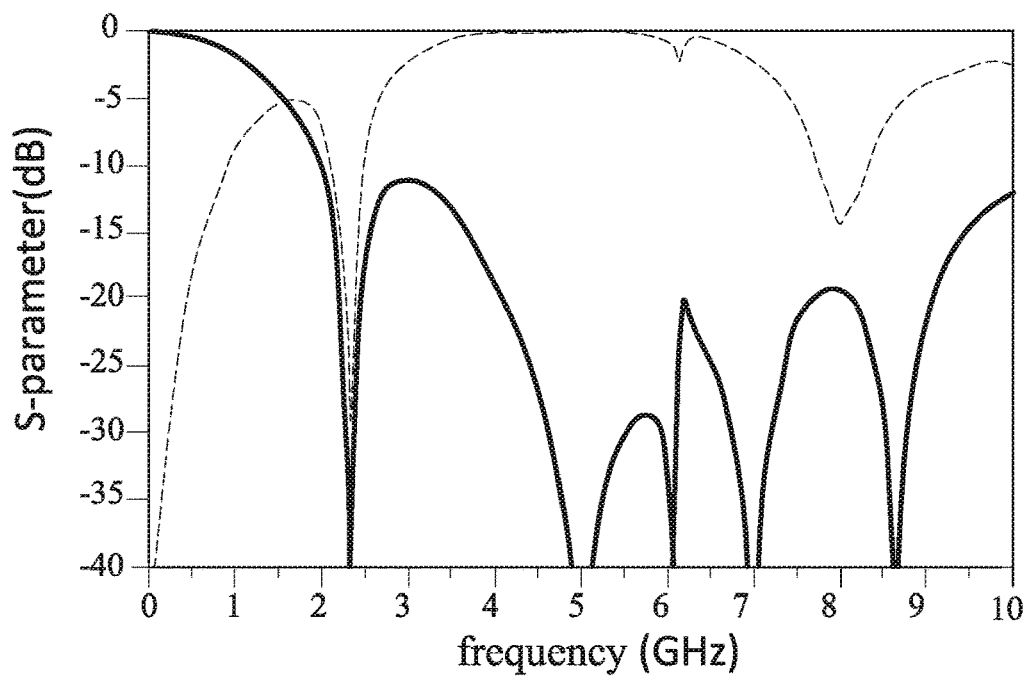
FIG. 28 is a frequency response diagram exemplarily illustrating transmission and reflection characteristics of common-mode noise of the circuit of the noise suppressor as depicted in FIG. 27 according to an embodiment of the disclosure.

FIG. 28 is a frequency response diagram that exemplarily illustrates the S-parameters respectively describing transmission and reflection characteristics of common-mode noise of the noise suppressor circuit of FIG. 27. The solid line in the diagram represents the S-parameter describing the transmission characteristic, and the broken line represents the S-parameter describing the reflection characteristic. It can be seen from the frequency response diagram that both transmission and reflection of common-mode noise are remarkably reduced in the frequency band of 2 GHz to 2.8 GHz, especially at the frequency of 2.3 GHz, which shows that the disclosed noise suppressor circuit of FIG. 27 may effectively absorb common-mode noise in said frequency band.

Figure 29:
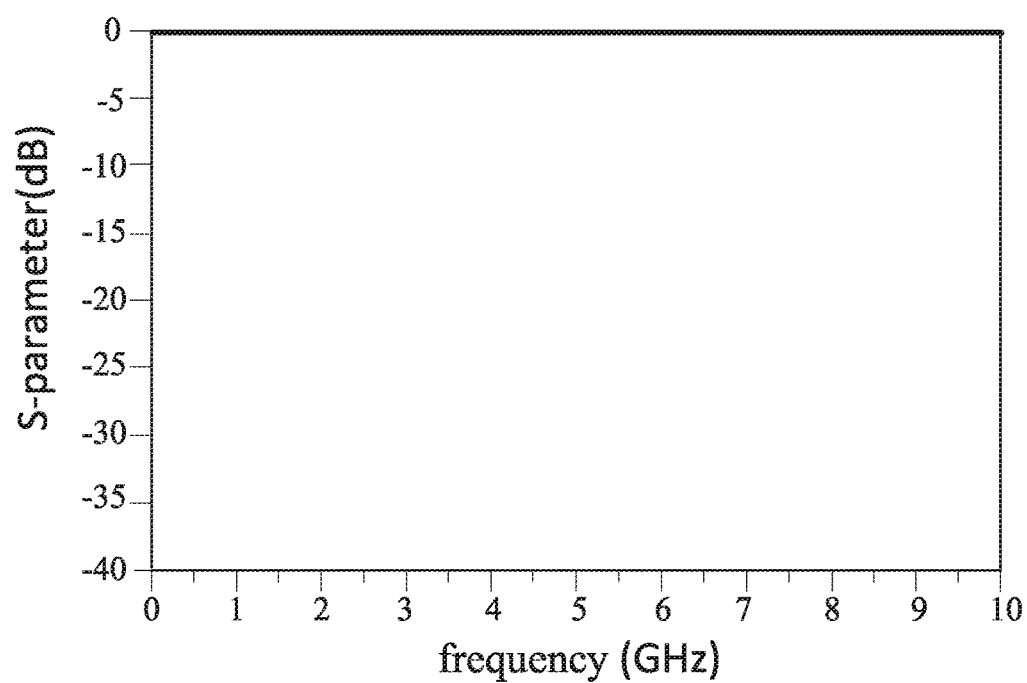
FIG. 29 is a frequency response diagram exemplarily illustrating transmission characteristic of differential-mode component of a differential signal transmitting through the circuit of FIG. 27 according to an embodiment of the disclosure.

FIG. 29 is a frequency response diagram that exemplarily illustrates the S-parameter describing transmission characteristic of a differential signal transmitting through the noise suppressor circuit of FIG. 27. It can be seen from the frequency response diagram that the differential signal may be well transmitted by said noise suppressor circuit.

While the two first differential-mode circuits 25 are identical and the two second differential-mode circuits 35 are identical in the first and second implementations of the disclosed noise suppressor as shown in FIGS. 24 and 27, they may each be a different one of the circuits depicted in FIGS. 5-10, or may have a same circuit structure as depicted in any of FIGS. 5-10, but with different device parameters (i.e., capacitance, inductance or impedance).

In summary, the disclosed noise suppressor is beneficial in that the disclosed noise suppressor may well absorb common-mode noise, and may well transmit differential signals inputted thereto. Specifically, the disclosed noise suppressor absorbs common-mode noise by means of the common-mode absorption module 4, so that the common-mode component of a differential signal inputted into the noise suppressor is substantially absorbed, and that the differential-mode component of the differential signal remains to be substantially outputted from the noise suppressor. The disclosed noise suppressor, which absorbs instead of reflecting common-mode noise, is further beneficial in that there is no reflected common-mode noise leaking out to other elements of peripheral circuits.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what is (are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A noise suppressor, comprising:
   a first differential-mode transmission module including a pair of first terminals, a pair of second terminals, and a third terminal;
   a second differential-mode transmission module including a pair of first terminals that are respectively and electrically connected to said second terminals of said first differential-mode transmission module, a pair of second terminals, and a third terminal, the pair of first terminals of said second differential-mode transmission module being electrically connected to the pair of second terminals of said first differential-mode transmission module respectively; and
   a common-mode absorption module including a first terminal that is electrically connected to said third terminal of said first differential-mode transmission module, a second terminal that is electrically connected to said third terminal of said second differential-mode transmission module, and a third terminal that is electrically connected to a reference node;
   said first and second differential-mode transmission modules being configured to receive a differential signal at said first terminals of said first differential-mode transmission module, and to permit the differential signal to be transmitted through said first and second differential-mode transmission modules to be outputted at said second terminals of said second differential-mode transmission module;
   said common-mode absorption module being configured to absorb common-mode noise of the differential signal from at least one of said first differential-mode transmission module or said second differential-mode transmission module.

2. The noise suppressor of claim 1, wherein:
   said common-mode absorption module further includes a first resistor that is electrically connected between said first terminal and said third terminal of said common-mode absorption module.

3. The noise suppressor of claim 2, wherein:
   said common-mode absorption module further includes a second resistor that is electrically connected between said second terminal and said third terminal of said common-mode absorption module.

4. The noise suppressor of claim 1, wherein said common-mode absorption module is configured to resonate with said first differential-mode transmission module in a first resonant frequency band in order to absorb the common-mode noise from said first differential-mode transmission module in the first resonant frequency band, and is configured to resonate with said second differential-mode transmission module in a second resonant frequency band in order to absorb the common-mode noise from said second differential-mode transmission module in the second resonant frequency band.

5. The noise suppressor of claim 1, wherein said common-mode absorption module further includes:
   a resonant circuit that is electrically connected to said first terminal and said second terminal of said common-mode absorption module, and that is configured to resonate with the at least one of said first differential-mode transmission module or said second differential-mode transmission module; and
   an energy consumption circuit that is electrically connected to said resonant circuit and to said third terminal of said common-mode absorption module, and that is configured to receive the common-mode noise via said resonant circuit and to consume the energy of the common-mode noise thus received.

6. The noise suppressor of claim 5, wherein:
   said resonant circuit includes an impedance component that is electrically connected between said first terminal and said second terminal of said common-mode absorption module; and
   said energy consumption circuit includes a first resistor that is electrically connected between said first terminal and said third terminal of said common-mode absorption module.

7. The noise suppressor of claim 6, wherein:
   said energy consumption circuit further includes a second resistor that is electrically connected between said second terminal and said third terminal of said common-mode absorption module.

8. The noise suppressor of claim 5, wherein:
   said resonant circuit includes a first impedance component, a second impedance component, and a third impedance component having a first terminal and a second terminal, said first impedance component being electrically connected between said first terminal of said common-mode absorption module and said first terminal of said third impedance component, said second impedance component being electrically connected between said second terminal of said common-mode absorption module and said second terminal of said third impedance component; and said energy consumption circuit includes a first resistor and a second resistor, said first resistor being electrically connected between said first terminal of said third impedance component and said third terminal of said common-mode absorption module, said second resistor being electrically connected between said second terminal of said third impedance component and said third terminal of said common-mode absorption module.

9. The noise suppressor of claim 5, wherein:

said resonant circuit includes a first impedance component having a first terminal and a second terminal, and a second impedance component, said first terminal of said first impedance component being electrically connected to said first terminal of said common-mode absorption module, said second impedance component being electrically connected between said second terminal of said first impedance component and said second terminal of said common-mode absorption module;

said energy consumption circuit includes a resistor that is electrically connected between said second terminal of said first impedance component and said third terminal of said common-mode absorption module.

10. The noise suppressor of claim 5, wherein:

said resonant circuit includes a first impedance component, a second impedance component, a third impedance component, a fourth impedance component having a first terminal and a second terminal, and a fifth impedance component having a first terminal and a second terminal, said first impedance component being electrically connected between said first terminal of said common-mode absorption module and said first terminal of said fourth impedance component, said second impedance component being electrically connected between said second terminal of said common-mode absorption module and said first terminal of said fifth impedance component, said third impedance component being electrically connected between said first terminal of said fourth impedance component and said first terminal of said fifth impedance component; and said energy consumption circuit includes a first resistor and a second resistor, said first resistor being electrically connected between said second terminal of said fourth impedance component and said third terminal of said common-mode absorption module, said second resistor being electrically connected between said second terminal of said fifth impedance component and said third terminal of said common-mode absorption module.

11. The noise suppressor of claim 5, wherein:

said resonant circuit includes a first impedance component, a second impedance component, and a third impedance component having a first terminal and a second terminal, said first impedance component being electrically connected between said first terminal of said common-mode absorption module and said first terminal of said third impedance component, said second impedance component being electrically connected between said second terminal of said common-mode absorption module and said first terminal of said third impedance component; and said energy consumption circuit includes a resistor that is electrically connected between said second terminal of said third impedance component and said third terminal of said common-mode absorption module.

12. The noise suppressor of claim 5, wherein:

said resonant circuit includes a first impedance component, a second impedance component having a first terminal and a second terminal, a third impedance component, a fourth impedance component having a first terminal and a second terminal, a fifth impedance component, a sixth impedance component having a first terminal and a second terminal, a first inductor parallelly connected with said second impedance component, a second inductor parallelly connected with said fourth impedance component, and a capacitor parallelly connected with said sixth impedance component, said first impedance component being electrically connected between said first terminal of said common-mode absorption module and said first terminal of said second impedance component, said third impedance component being electrically connected between said second terminal of said common-mode absorption module and said first terminal of said fourth impedance component, said fifth impedance component being electrically connected between said second terminal of said second impedance component and said first terminal of said sixth impedance component, said second terminal of said sixth impedance component being electrically connected to said second terminal of said fourth impedance component; and said energy consumption circuit includes a first resistor and a second resistor, said first resistor being electrically connected between said second terminal of said second impedance component and said third terminal of said common-mode absorption module, said second resistor being electrically connected between said second terminal of said fourth impedance component and said third terminal of said common-mode absorption module.

13. The noise suppressor of claim 5, wherein:

said resonant circuit includes a first impedance component, a second impedance component having a first terminal and a second terminal, a third impedance component, a fourth impedance component having a first terminal and a second terminal, a fifth impedance component, a sixth impedance component having a first terminal and a second terminal, a seventh impedance component having a first terminal and a second terminal, an eighth impedance component having a first terminal and a second terminal, a first inductor parallelly connected with said second impedance component, a second inductor parallelly connected with said fourth impedance component, and a capacitor parallelly connected with said sixth impedance component, said first impedance component being electrically connected between said first terminal of said common-mode absorption module and said first terminal of said second impedance component, said third impedance component being electrically connected between said second terminal of said common-mode absorption module and said first terminal of said fourth impedance component, said fifth impedance component being electrically connected between said second terminal of said second impedance component and said first terminal of said sixth impedance component, said second terminal of said sixth impedance component being electrically connected to said second terminal of said fourth impedance component, said first terminal of said seventh impedance component being electrically connected to said second terminal of said second impedance component, said first terminal of said eighth impedance component being electrically connected to said second terminal of said fourth impedance component; and said energy consumption circuit includes a first resistor and a second resistor, said first resistor being electrically connected between said second terminal of said seventh impedance component and said third terminal of said common-mode absorption module, said second resistor being electrically connected between second terminal of said eighth impedance component and said third terminal of said common-mode absorption module.

14. The noise suppressor of claim 5, wherein:

said resonant circuit includes a first inductor, a second inductor, and a capacitor having a first terminal and a second terminal, said first inductor being electrically connected between said first terminal of said common-mode absorption module and said first terminal of said capacitor, said second inductor being electrically connected between said second terminal of said common-mode absorption module and said second terminal of said capacitor; and said energy consumption circuit includes a first resistor and a second resistor, said first resistor being electrically connected between said first terminal of said capacitor and said third terminal of said common-mode absorption module, said second resistor being electrically connected between said second terminal of said capacitor and said third terminal of said common-mode absorption module.

15. The noise suppressor of claim 5, wherein:

said resonant circuit includes a first inductor having a first terminal and a second terminal, and a second inductor, said first terminal of said first inductor being electrically connected to said first terminal of said common-mode absorption module, said second inductor being electrically connected between said second terminal of said first inductor and said second terminal of said common-mode absorption module;

said energy consumption circuit includes a resistor that is electrically connected between said second terminal of said first inductor and said third terminal of said common-mode absorption module.

16. The noise suppressor of claim 5, wherein:

said resonant circuit includes a first inductor, a second inductor, a first capacitor, a second capacitor having a first terminal and a second terminal, and a third capacitor having a first terminal and a second terminal, said first inductor being electrically connected between said first terminal of said common-mode absorption module and said first terminal of said second capacitor, said second inductor being electrically connected between said second terminal of said common-mode absorption module and said first terminal of said third capacitor, said first capacitor being electrically connected between said first terminal of said second capacitor and said first terminal of said third capacitor; and said energy consumption circuit includes a first resistor and a second resistor, said first resistor being electrically connected between said second terminal of said second capacitor and said third terminal of said common-mode absorption module, said second resistor being electrically connected between said second terminal of said third capacitor and said third terminal of said common-mode absorption module.

17. The noise suppressor of claim 1, wherein:

one of said first differential-mode transmission module and said second differential-mode transmission module further includes two differential-mode circuits, each of which has a low-pass frequency response; and each of said differential-mode circuits is electrically connected among a respective one of said first terminals of said one of said first and second differential-mode transmission modules, a respective one of said second terminals of said one of said first and second differential-mode transmission modules, and said third terminal of said one of said first and second differential-mode transmission modules.

18. The noise suppressor of claim 17, wherein each of said differential-mode circuits includes:

an inductor having a first terminal electrically connected to the respective one of said first terminals of said one of said first and second differential-mode transmission modules, and a second terminal electrically connected to the respective one of said second terminals of said one of said first and second differential-mode transmission modules; and a capacitor electrically connected between said third terminal of said one of said first and second differential-mode transmission modules and one of said first and second terminals of said inductor.

19. The noise suppressor of claim 1, wherein:

one of said first differential-mode transmission module and said second differential-mode transmission module further includes two differential-mode circuits, each of which has an all-pass frequency response; and each of said differential-mode circuits is electrically connected among a respective one of said first terminals of said one of said first and second differential-mode transmission modules, a respective one of said second terminals of said one of said first and second differential-mode transmission modules, and said third terminal of said one of said first and second differential-mode transmission modules.

20. The noise suppressor of claim 1, wherein:

said first and second differential-mode transmission modules are configured to receive another differential signal at said second terminals of said second differential-mode transmission module, and to permit the another differential signal to be transmitted through said first and second differential-mode transmission modules to be outputted at said first terminals of said first differential-mode transmission module; and said common-mode absorption module is configured to absorb common-mode noise of the another differential signal from the at least one of said first differential-mode transmission module or said second differential-mode transmission module.

* * * * *